(12) United States Patent
Najibi et al.

(10) Patent No.: US 10,353,789 B1
(45) Date of Patent: Jul. 16, 2019

(54) ANALOG FAULT SIMULATION CONTROL WITH MULTIPLE CIRCUIT REPRESENTATIONS

(71) Applicant: Mentor Graphics Corporation, Wilsonville, OR (US)

(72) Inventors: Tina Najibi, San Jose, CA (US); Stephen Kenneth Sunter, Nepean (CA); Mark Hanson, San Jose, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/885,159

(22) Filed: Jan. 31, 2018

(51) Int. Cl.
| | |
|---|---|
| *G06F 11/26* | (2006.01) |
| *G06F 17/50* | (2006.01) |
| *G01R 35/04* | (2006.01) |
| *G01R 31/28* | (2006.01) |

(52) U.S. Cl.
CPC ........ *G06F 11/261* (2013.01); *G01R 31/2848* (2013.01); *G01R 35/04* (2013.01); *G06F 17/5036* (2013.01); *G06F 17/5045* (2013.01); *G06F 17/5072* (2013.01); *G06F 17/5081* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,426,591 | A * | 6/1995 | Ginetti | G06F 17/5031 703/19 |
| 9,117,046 | B1 * | 8/2015 | Schumacher | G06F 17/505 |
| 9,798,840 | B1 * | 10/2017 | Ginetti | G06F 17/5081 |
| 10,204,180 | B1 * | 2/2019 | Huang | G06F 17/5068 |
| 2003/0084416 | A1 * | 5/2003 | Dai | G06F 17/5045 716/55 |
| 2006/0090144 | A1 * | 4/2006 | Lakshmanan | G06F 17/5081 716/112 |
| 2007/0113127 | A1 * | 5/2007 | Nonaka | G06F 17/505 714/724 |
| 2008/0091987 | A1 * | 4/2008 | Nonaka | G01R 31/318357 714/703 |
| 2010/0005041 | A1 * | 1/2010 | Wang | G06N 20/00 706/12 |

(Continued)

*Primary Examiner* — Joseph D Torres
(74) *Attorney, Agent, or Firm* — Mentor Graphics Corporation

(57) ABSTRACT

This application discloses a computing system to identify multiple views of cells in a circuit design for selective utilization during analog fault simulation of the circuit design. The views of the cells can include two or more of macromodel design views, schematic design views, or extracted design views that includes parasitic elements extracted from a physical layout of the circuit design. The computing system can prompt generation of multiple netlists, each netlist generated based on a different combination of the identified views of the cells in the circuit design, or a list of macromodels with pin accurate subcircuit wrappers, parse and organize the cells in each netlist or the list of macromodels, identify one of the cells to inject with a defect, and selectively simulate portions from a plurality of the netlists based, at least in part, on the identified one of the cells to inject with the defect.

20 Claims, 6 Drawing Sheets

(56) References Cited

U.S. PATENT DOCUMENTS

2010/0115485 A1\* 5/2010 Nonaka .............. G06F 17/5045
 716/119
2016/0085898 A1\* 3/2016 Manohar ............ G06F 17/5068
 716/124

\* cited by examiner

US 10,353,789 B1

ANALOG FAULT SIMULATION CONTROL WITH MULTIPLE CIRCUIT REPRESENTATIONS

TECHNICAL FIELD

This application is generally related to electronic design automation and, more specifically, to a control interface for analog fault simulation using integrated circuit (IC) testing technology.

BACKGROUND

Integrated circuits (ICs) may include defects and faults, which can alter their intended functionality and/or render them unusable. A defect can be an unintended physical change in the IC caused by an unintended aspect of a manufacturing process or a post-manufacturing overstress process, while a fault can be an unintended behavior of the IC, such as a circuit node stuck at a constant voltage. IC testing technology can perform tests on the ICs to detect a presence of a defect or a fault in the ICs.

Not all tests performed by the IC testing technology, however, are equivalent, as some tests may detect a presence of a defect or a fault when other tests would fail to detect the presence of the defect or fault. Fault simulation can measure or estimate a percentage of potential defects or potential faults in the IC that could be detected by a test applied to the IC and provide fault coverage for the test. Fault coverage can be a probability or a likelihood of the IC failing a test when the IC includes a defect or a fault. One technique of measuring fault coverage includes calculating a percentage of potential defects or potential faults that can be detected by the test, for example, dividing the number of defects or faults detected by the total number of potential defects simulated. The fault coverage calculation also may weight each potential defect or fault by its relative likelihood of occurring.

A fault simulator, for example, implemented by a computing system, can perform fault simulation on a circuit design for the IC, by selectively injecting faults into the circuit design for the IC, and simulating the IC based on the circuit design while applying a test and recording which of the injected faults were detected. The fault simulator can inject faults or defects into a design-intent netlist version of the circuit design, for example, specified at a transistor-level of abstraction, or into a physical-implementation netlist version, for example, generated by extracting design-intent elements and parasitic elements from a physical layout of the circuit design. Since the physical-implementation netlist includes parasitic elements, such as resistive, capacitive, and/or inductive elements introduced due to a geometric layout of the design, the fault simulation of the physical-implementation netlist can have a higher accuracy, but longer simulation time compared to the design-intent netlist.

Typically, the fault simulator can first simulate a netlist for the circuit design and a test without injecting any faults or defects. The fault simulator can then iteratively inject a defect or fault into different portions of the netlist for the circuit design and record whether the injected defect or fault was detected by the test. In some examples, the fault simulator, during simulation of the circuit design, can apply a test stimulus, such as sine waves or digital patterns, to the simulated circuit design, measure signals of the circuit design in response to the test stimulus, and determine parameters of the signals, for example, output signal amplitude, delay, or the like. The fault simulator also can calculate parameter values from the measurements, such as a gain value, which corresponds to the output signal amplitude divided by an input signal amplitude, or the like, and attempt to detect the defect or the fault in the simulated IC by comparing each parameter or parameter value to lower and/or upper test limits.

SUMMARY

This application discloses a computing system to identify multiple views of cells in a circuit design for selective utilization during fault simulation of the circuit design. The views of the cells can include two or more of macromodel design views, schematic design views, or extracted design views that includes parasitic elements extracted from a physical layout of the circuit design. The computing system can prompt generation of multiple netlists, with each netlist generated based on a different combination of the identified views of the cells in the circuit design, or a list of macromodel cells with a pin accurate subcircuit wrapper for each cell to be parsed and organized after each netlist or macromodel list generation by the fault tool. After all netlists and macromodel lists have been parsed and organized, the fault tool can identify one of the cells to inject with a defect, and selectively choose other cell representations based, at least in part, on the identified one of the cells to inject with the defect and the organized group of separate cells. Embodiments will be described in greater detail below.

DETAILED DESCRIPTION

Illustrative Operating Environment

Figure 1:
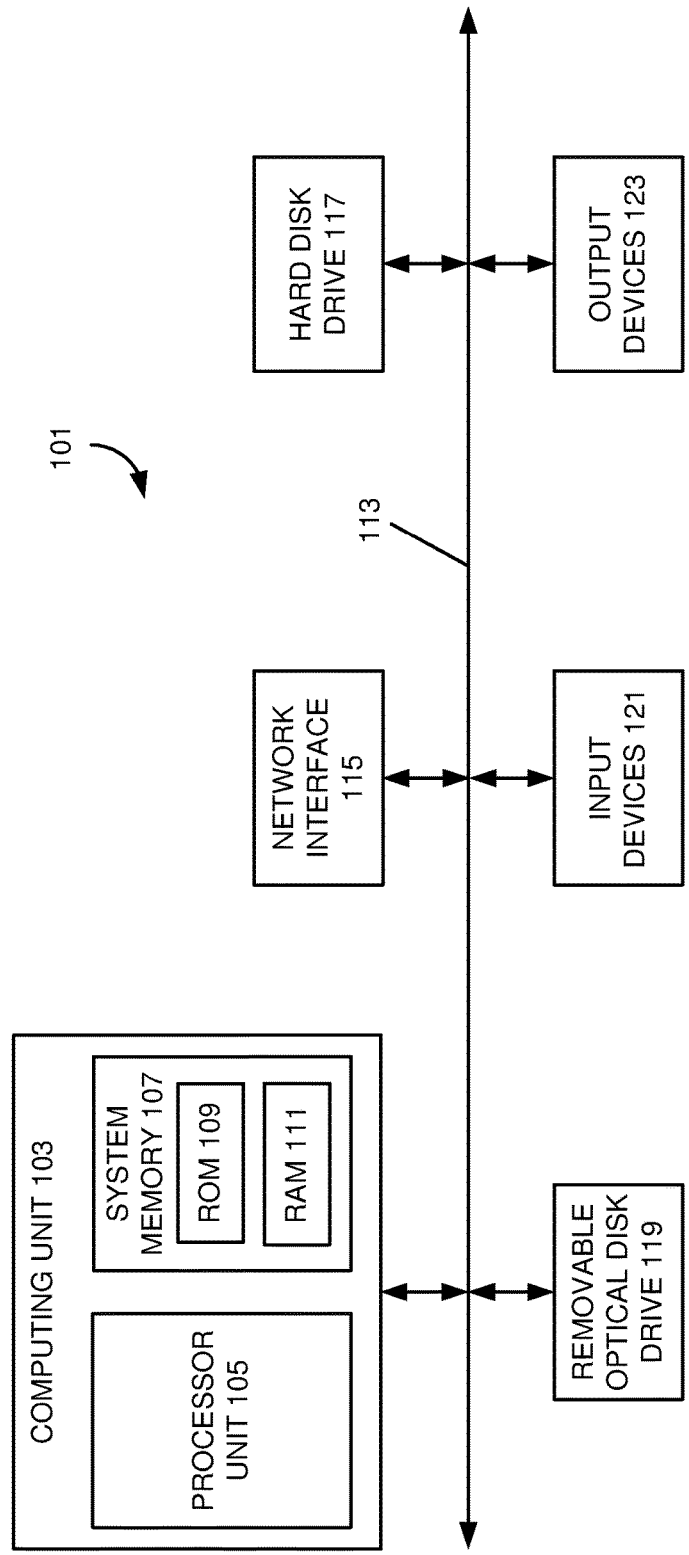
FIGS. 1 and 2 illustrate an example of a computer system of the type that may be used to implement various embodiments.

Various embodiments may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a touch screen, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
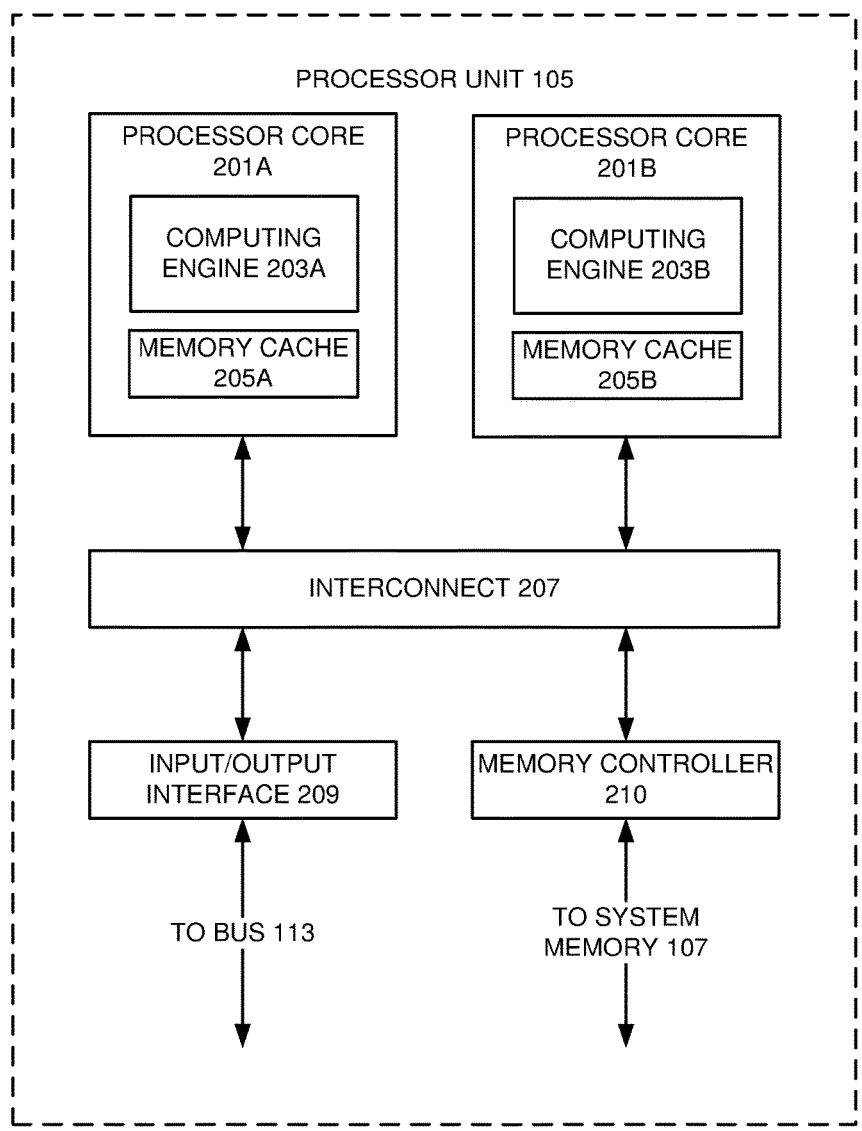

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Analog Fault Simulation Control with Multiple Circuit Representations

Figure 3:
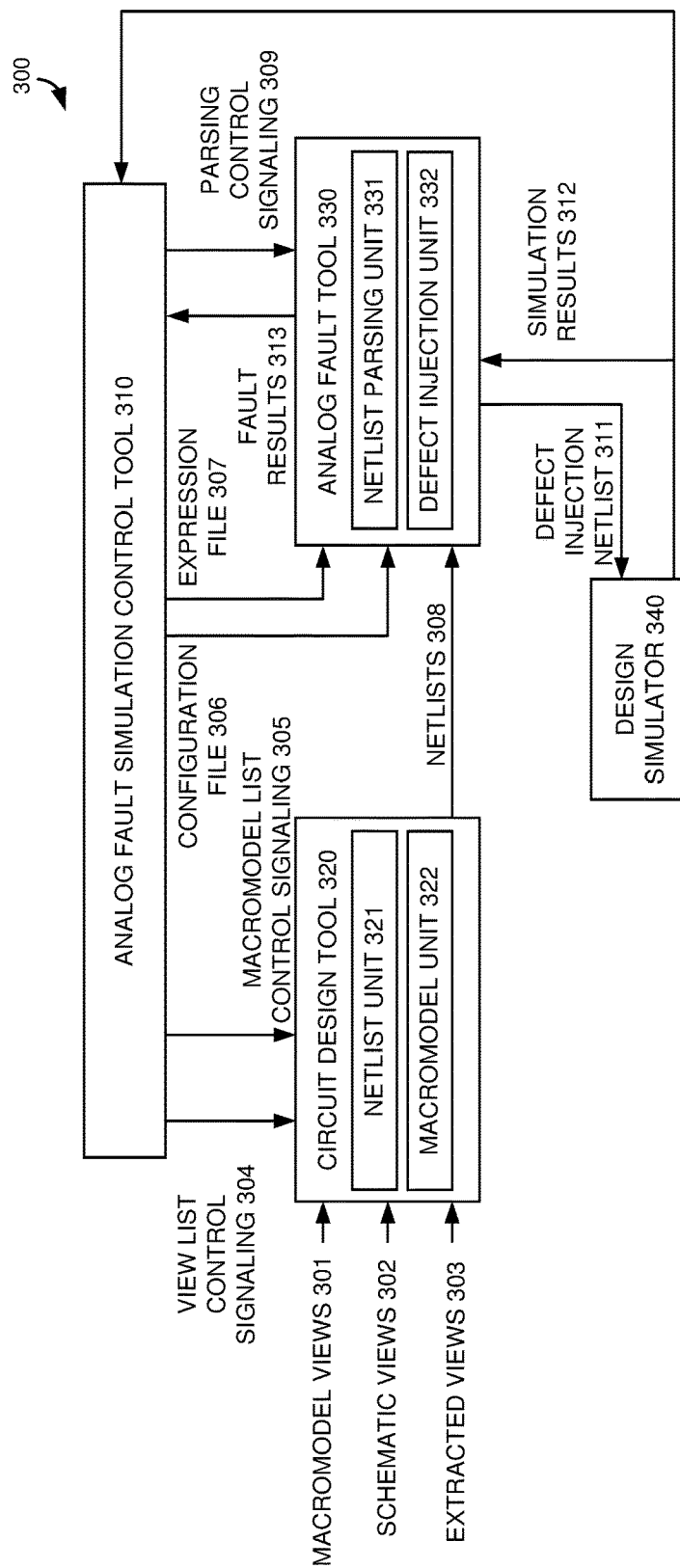
FIG. 3 illustrates an example of analog fault detect system including an analog fault simulation control tool according to various embodiments.

FIG. 3 illustrates an example of analog fault simulation system 300 including an analog fault simulation control tool 310 according to various embodiments. Referring to FIG. 3, the analog fault simulation system 300 can include a circuit design tool 320 to receive multiple representations of a circuit design for an IC or electronic system, such as macromodel views 301, schematic views 302, and extracted views 303. The macromodel views 301 can correspond to macromodel representations of one or more cells in the circuit design. The schematic views 302 can correspond to schematic representations of one or more of the cells in the circuit design. The extracted views 303 can correspond to extracted representations of one or more of the cells in the circuit design. In some embodiments, the macromodel views 301, the schematic views 302, and the extracted views 303 can be stored in a database or memory system accessible by the circuit design tool 320, so the circuit design tool 320 can retrieve the macromodel views 301, the schematic views 302, and the extracted views 303 from the database or the memory system.

The macromodel views 301 can describe cells in the circuit design for the IC at a behavioral level or functional level. In some embodiments, the macromodel views 301 can include text models of cells or subcircuits in the circuit design based on text view types, for example, specified in a Verilog-A language, a VHSIC Hardware Description Language (VHDL)-A language, a digital behavior language such as Verilog or VHDL, or the like. The schematic views 302 can describe cells or subcircuits in the circuit design for the IC at a transistor-level, for example, as binary data in Open Access (OA) format or the like that corresponds to a schematic drawing of the cells in the circuit design. The extracted views 303 can describe cells or subcircuits in the circuit design for the IC with a transistor-level abstraction, while also including parasitic elements, such as resistors, capacitors, and/or inductors, extracted from a physical layout design of the IC. The extracted views 303 can be binary data, for example, in the Open Access (OA) format or the like, for design elements of the IC and the parasitic elements extracted from the layout design of the IC.

The circuit design tool 320 can receive netlist control signaling 304 from the analog fault simulation control tool 310, which can prompt a netlist unit 321 in the circuit design tool 320 to generate netlists 308 from the macromodel views 301, the schematic views 302, and/or the extracted views 303 for selective utilization during analog fault simulation. The netlists 308 can be textual models for the different representations of the circuit design. In some embodiments, the netlist unit 321 can traverse the different representations of the circuit design and, for the schematic views 302 and/or the extracted views 303 representations, convert the binary data into the textual models. In some embodiments, the netlist control signaling 304 can identify an ordered list of a plurality of the macromodel views 301, the schematic views 302, and/or the extracted views 303 for each netlist to be generated. The circuit design tool 320 can generate the netlists 308 based, at least in part, on this order list of views. For example, when the netlist control signaling 304 has an ordered list of views having the macromodel views 301 followed by the schematic views 302, the circuit design tool 302 can identify which cells in the circuit design have corresponding text models associated with the macromodel views 301 and populate a netlist with text models from the macromodel views 301 corresponding to the identified cells in the circuit design. For the remaining cells in the circuit design, such as those without a corresponding macromodel view 301, the circuit design tool 320 can populate the netlist for those cells with text models from the schematic views 302.

Since each netlist 308 newly generated by the netlist unit 321 may overwrite a previously generated netlist 308 in the circuit design tool 320, in some embodiments, the analog fault simulation control tool 310 can iteratively provide netlist control signaling 304 to circuit design tool 320 to sequence generation of the netlists 308 by the netlist unit 321. For example, the analog fault simulation control tool 310 can send the netlist control signaling 304 to the circuit design tool 320, which can prompt the netlist unit 321 to generate a first netlist from the macromodel views 301 and forward the first netlist to an analog fault tool 330. The analog fault simulation control tool 310 can again send the netlist control signaling 304 to the circuit design tool 320, which can prompt the netlist unit 321 to generate a second netlist from the schematic views 302 and forward the second netlist to the analog fault tool 330. The analog fault simulation control tool 310 can yet again send the netlist control signaling 304 to the circuit design tool 320, which can prompt the netlist unit 321 to generate a third netlist from the extracted views 303 and forward the third netlist to the analog fault tool 330. Each transmission of the netlist control signaling 304 can identify which representation of the circuit design, such as the macromodel views 301, the schematic views 302, and/or the extracted views 303, for the netlist unit 321 to utilize to generate one of the netlists 308. In some embodiments, the analog fault simulation control tool 310 can send the netlist control signaling 304 once and prompt the circuit design tool 320 to sequentially generate and forward the netlists 308, one after the other, to the analog fault tool 330, which can parse and organize the cells in the netlists between each netlist generation. Embodiments of the analog fault simulation control tool and the netlist control signaling will be described below in greater detail.

The circuit design tool 320 also can receive macromodel control signaling 305 from the analog fault simulation control tool 310, which can prompt a macromodel unit 322 in the circuit design tool 320 to generate a list of macromodels based on text view types, such as Verilog-A, VHDL, Verilog, or the like, within the macromodel views 301. The list of the macromodels can include an identification of each macromodel along with the location of the text model of the macromodel. Each macromodel in the list can be included in a subcircuit wrapper that includes a correct behavioral bus or bit pin list declaration. The macromodel list can provide a list of available macromodels, unlike the netlist of the macromodel view list. For example, when the circuit design includes a cell A and a cell B with cell B instantiated or called from the cell A, and the cell A and the cell B have both a schematic representation and a macromodel representation, a netlist of schematic views can include both the cell A and the cell B, while a netlist of macromodel views includes the macromodel representation for the cell A and does not include the macromodel representation for the cell B due to the instantiation of the cell B from the cell A. The list of macromodels, however, can include the macromodel representation of the cell B. The circuit design tool 320 can forward the list of macromodels to the analog fault tool 330 to parse and organize for selective utilization during analog fault simulation.

The analog fault simulation control tool 310 also can generate a configuration file 306 and an expression file 307 and transmit them to the analog fault tool 330. The configuration file 306 can include a configuration for the analog fault tool 330 to utilize during a fault simulation of the IC described in the netlists 308. In some embodiments, the configuration may be customized based on user input, for example, receive via the computer system 101. The expression file 307 can include one or more expressions of measurements along with lower and upper bounds for the analog fault tool 330 to utilize to determine whether any defects or faults injected into a simulated circuit design generated based on the netlists 308 could be detected during the fault simulation. A defect can correspond to an unintended physical change in the IC caused by an unintended aspect of a manufacturing process or a post-manufacturing overstress process, while a fault can correspond to an unintended behavior of the IC, such as a circuit node stuck at a constant voltage.

The analog fault tool 330 can receive the configuration file 306 and the expression file 307 from the analog fault simulation tool 310, and receive the netlists 308 from the circuit design tool 320. The analog fault tool 330 can include a netlist parsing unit 331 to parse the netlists 308 on a subcircuit or cell basis. The netlist parsing unit 331 can organize the parsed cells or subcircuits from the netlists 308 based on a type of view associated with each of the parsed cells or subcircuits. For example, when the netlist parsing unit 331 parses macromodel views of cells and schematic views of cells from a netlist, the netlist parsing unit 331 can arrange the macromodel views of cells in one group and the schematic views of the cells in another group. This organization of different representations by views can allow selection between the different representations of the circuit design for the IC during the fault simulation. In some embodiments, the netlist parsing unit 331 can receive the macromodel list generated by the circuit design tool 320, which can include a list of the macromodels views along with the behavioral pin-accurate subcircuit wrapper for cells in the circuit design.

Since the netlist unit 321 in the circuit design tool 320 can overwrite netlists 308 during each new netlist generation, the analog fault tool 330 can receive parsing control signaling 309 from the analog fault simulation control tool 310, which can direct the netlist parsing unit 331 to sequentially perform the parsing of the netlists 308 and subsequent cell location organization. For example, when the circuit design tool 320 provides the netlists 308 in an iterative or serial-fashion, the parsing control signaling 309 can prompt the netlist parsing unit 331 to parse the netlists 308 in an iterative or serial fashion.

The analog fault tool 330 can include a defect injection unit 332 to analyze the parsed netlists to identify locations that defects or faults may be injected into cells having a corresponding schematic view or a corresponding extracted view. The defect injection unit 332 can generate a defect site list of the identified locations in the circuit design that defects or faults may be injected. The defect injection unit 332 also can create the defects or faults that can be injected into the identified locations in the circuit design.

The defect injection unit 332 can generate a defect injection netlist 311 that includes an aggregate netlist of the circuit design, for example, having different representations for the cells or subcircuits as well as a test bench configured to generate test stimulus during fault simulation. The aggregate netlist can include schematic views or layout views of cells or subcircuits to be injected with defects and include macromodel views for the other cells in the circuit design to decrease simulation time. The defect injection unit 332 also can utilize the defect site list and the created defects or faults to generate alter statements in the defect injection netlist 311. The alter statements can identify which defect or faults to inject during each fault simulation run and the corresponding locations to inject each defect or fault.

The analog fault simulation system 300 can include a design simulator 340 to receive the defect injection netlist 311 from the analog fault tool 330. The design simulator 340 can iteratively simulate the aggregate netlist from the defect injection netlist 311 with selective injection of defects. The test bench in the aggregate netlist can generate test stimulus, such as sine waves or digital patterns, during simulation, which can be provided to the simulated circuit design. The design simulator 340 can measure signals associated with the simulated circuit design in response to the test stimulus, and determine various measurements of the signals, for example, output signal amplitude, delay, or the like. The design simulator 340 can include the signals and parameters in simulation results 312, which can be returned to the analog fault tool 330 and to the analog fault simulation control tool 310, for example, for inclusion in a displayable presentation.

In some embodiments, the design simulator 340 can initially simulate the aggregate netlist in the defect injection netlist 311 without injecting any defects or faults into the aggregate netlist. The design simulator 340 can iteratively re-simulate the aggregate netlist with a different defect or fault injected for each simulation until the defects or faults in the defect injection netlist 311 have been simulated.

Since the analog fault tool 330 may have been provided with multiple design representations of one or more cells or subcircuits in the integrated circuit design, the analog fault tool 330 can select which of the multiple design representations to utilize during simulation based, at least in part, on which cell the defect was injected into. For example, the analog fault tool 330 can inject defects into design representations that have a transistor-level of abstraction or lower, such as the design representations derived from the schematic views 302 or the extracted views 303. Since the design representations corresponding to the macromodel views 301 can be simulated more quickly, the analog fault tool 330 can select one of the design representations derived from the schematic views 302 or the extracted views 303 for the cell to be injected with a defect or fault and then select the design representations corresponding to the macromodel views 301 for the other cells, if available. By using higher-level design representations for one or more of the cells not injected with a defect or fault, the design simulator 340 can simulate the aggregate netlist more quickly without a loss of accuracy in the cell injected with the defect or fault. The ability of the analog fault tool 330 to select higher-level design representations for the cells not injected with a defect or fault can be due to iterative creation of the netlists 308 having the available design representations, such as the macromodel views 301, the schematic views 302, and/or extracted views 303, and the subsequent parsing of the netlists 308, which can avoid netlist overwriting within the circuit design tool 320.

The analog fault tool 330 can receive the simulation results 312 from the design simulator 340. The analog fault tool 330 can analyze the simulation results to identify measured values, such as a gain value, which corresponds to the output signal amplitude divided by an input signal amplitude, or the like. The analog fault tool 330 can compare the measured values calculated utilizing the expression file 307 to determine whether the test stimulus and the measurement expressions detect the defects or faults injected in the aggregate netlist. The analog fault tool 330 can utilize the analysis to generate fault results 313, such as a percentage of the defects or faults injected in the circuit design that could be detected during fault simulation, a fault coverage for the circuit design, which can correspond to a probability or a likelihood of the IC failing the test utilized during the fault simulation when the IC includes a defect or a fault, or the like. The analog fault tool 330 can provide fault results 313 to the analog fault simulation control tool 310, for example, for inclusion in a displayable presentation.

Figure 4:
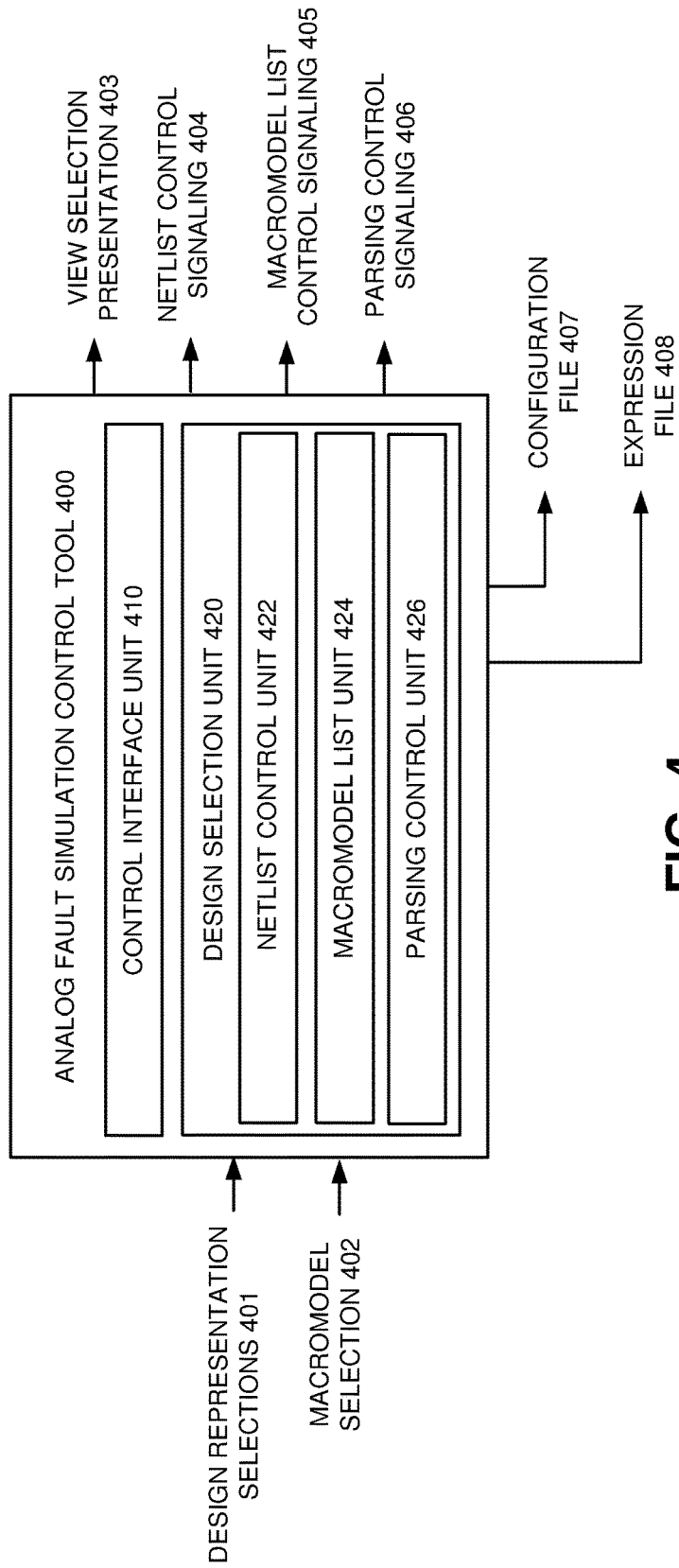
FIG. 4 illustrates an example analog fault simulation control tool according to various embodiments.

FIG. 4 illustrates an example analog fault simulation control tool 400 according to various embodiments. Referring to FIG. 4, the analog fault simulation control tool 400 can include a control interface unit 410 to generate a view selection presentation 403, which can provide a graphical user interface for selection of design representations, such as a macromodel view list, a schematic view list, and/or an extracted view list, for use in analog fault simulation. The graphical user interface also can allow for creation of a list of Verilog-A models, or the like, and the selection of a file, which can be utilized to generate a list of Verilog-A cells or subcircuits in the selected Verilog-A file along with a subcircuit declaration wrapper with a correct behavioral bus or bit pin list. This list can include other macromodel views such as Verilog or VHDL or the like. Embodiments of the graphical user interface will be described below in greater detail with reference to FIG. 5.

Figure 5:
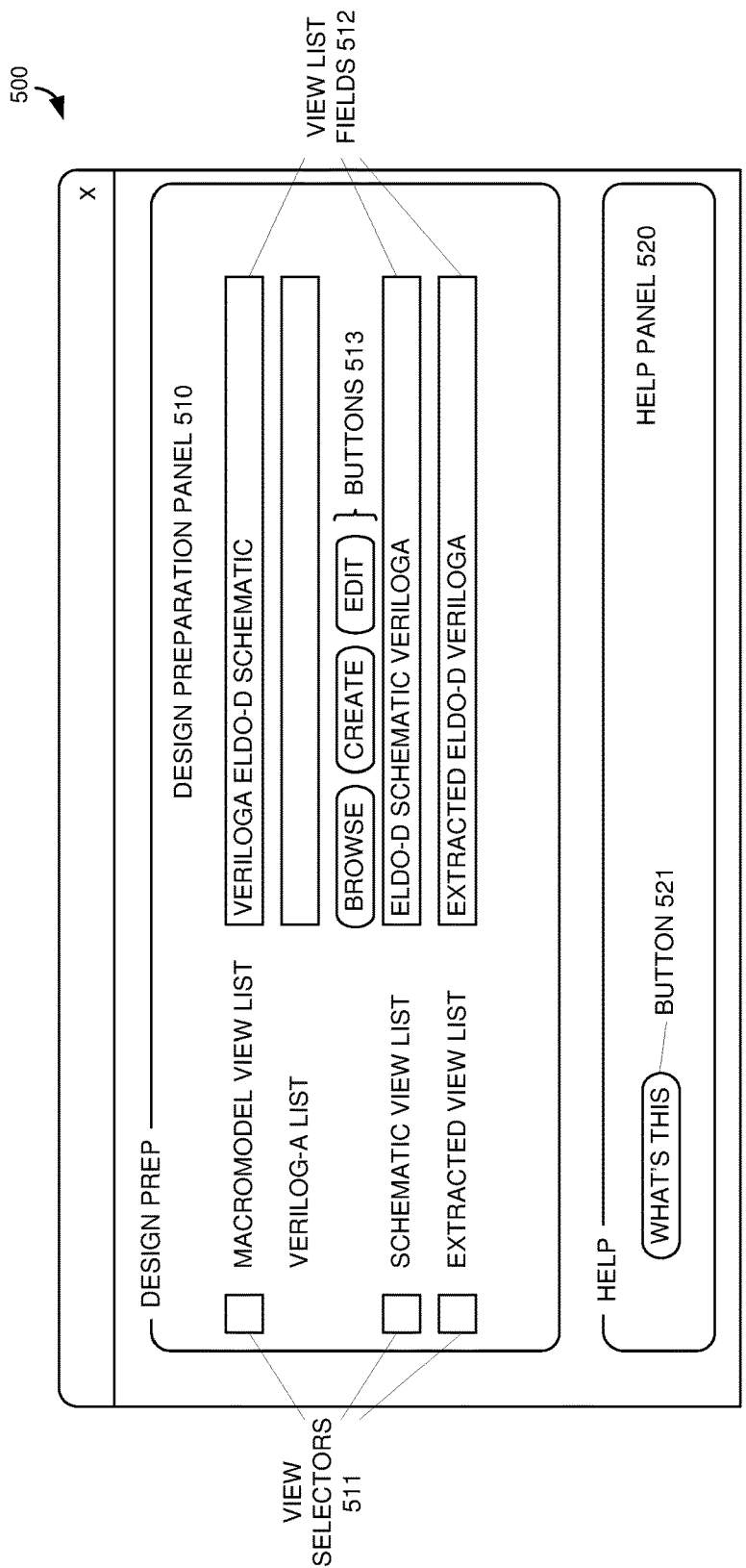
FIG. 5 illustrates an example graphical user interface for controlling analog fault simulation according to various examples.

FIG. 5 illustrates an example graphical user interface 500 for controlling analog fault simulation according to various examples. Referring to FIG. 5, the graphical user interface 500 can be presented in an analog fault simulation control tool. The graphical user interface 500 can receive input, for example, via user input devices, such as the input devices 121 described in FIG. 1, and provide the received input to the analog fault simulation control tool. Based on the input, the analog fault simulation control tool can update the graphical user interface 500 to annunciate the received input, for example, by indicating a selection made by the received input, displaying text entered via the received input, or the like.

The graphical user interface 500 can include a design preparation panel 510 having rows of design representations capable of selection with view selectors 511. The view selectors 511 may be selectable boxes or buttons that, when actuated via the graphical user interface 500 in response to the received input, can indicate which of the design representations to provide to the analog fault tool. In some embodiments, the selection of the design representations in the view selectors 511 can indicate to the analog fault simulation control tool which design representation to prompt the circuit design tool to utilize in creating netlists for analog fault tool. The graphical user interface 500 also can include a Verilog-A, or the like, row, which can correspond to generation of a macromodel list along with a subcircuit declaration wrapper with a correct behavioral bus or bit pin list by the circuit design tool.

The rows of design representations and the Verilog-A row also can have corresponding view list fields 512, which can be fillable with names of design views or a Verilog-A file corresponding to the rows. The Verilog-A file can include a macromodel text representation of cells in the circuit design, but not limited by only Verilog-A type macromodel text representations of cells in the circuit design. The design preparation panel 510 also can include buttons 513, such as a browse tab, a create tab, an edit tab, or the like. The buttons 513, when selected, can allow browsing, creating, and/or editing of Verilog-A, or the like, views available for the cells in the circuit design.

The graphical user interface 500 can include a help panel 520 having button 521 that, when selected, can pop-up or generate a new window with instructions for utilizing the graphical user interface 500, such as selecting the view selectors 511, filling out the view list fields 512, utilizing buttons 513, or the like.

Referring back to FIG. 4, the analog fault simulation control tool 400 can include a design selection unit 420 to generate control signaling, such as netlist control signaling 404, macromodel list control signaling 405, and parsing control signaling 406, based on the design representation selections 401 and/or macromodel selection 402 received from the graphical user interface.

The design selection unit 420 can include a netlist control unit 422 that can generate the netlist control signaling 404 based on the design representation selections 401 received from the graphical user interface. The netlist control signaling 404 can prompt a circuit design tool to generate netlists for the design representations, such as a macromodel design, a schematic design, and/or an extracted design, selected in the design representation selections 401. The circuit design tool, in response to the netlist control signaling 404, can forward the netlists for the design representations to the analog fault tool, to be parsed and organized, for example, after each netlist sent for later selective utilization during analog fault simulation.

The netlist control unit 422 can parse the design representation selections 401 to identify which of the design representations, such as a macromodel design, a schematic design, and/or an extracted design, were selected in the design representation selections 401. For each of the selected design representations, the netlist control unit 422 can generate the netlist control signaling 404. In some embodiments, the netlist control signaling 404 can be multiple control signals that the analog simulation control tool 400 can iteratively provide to the circuit design tool. For example, the circuit design tool, in response to a first netlist control signal, can complete a netlist for one design representation and forward it to an analog fault tool before the netlist control unit 422 sends a second control signal prompting the circuit design tool to complete a netlist for another design representation and forward it to the analog fault tool.

The design selection unit 420 can include a macromodel list unit 424 to generate the macromodel list control signaling 405 based on the macromodel selection 402 received from the graphical user interface. The macromodel list control signaling 405 can prompt a circuit design tool to generate a list of macromodels from a design. The list of the macromodels can include an identification of each macromodel design element along with the location of the text model of each macromodel design element and a subcircuit declaration wrapper with a correct behavioral bus or bit pin list. The circuit design tool, in response to the macromodel list control signaling 405, can forward the list of macromodels to the analog fault tool to parse and organize for later selective utilization during analog fault simulation. The macromodel list unit 424 can parse the macromodel selection 402 to identify a file name for the macromodel list. Based on the identification of the file name for the macromodel list, the macromodel list unit 424 can generate the macromodel list control signaling 405.

The design selection unit 420 can include a parsing control unit 426 to generate the parsing control signaling 406 based on the design representation selections 401 and/or macromodel selection 402 received from the graphical user interface. The parsing control signaling 406 can prompt the analog fault tool to parse and organize the cells in the netlists and the macromodel list for the design representations received from the circuit design tool.

The parsing control unit 422 can parse the design representation selections 401 and/or macromodel selection 402 to identify which of the design representations, such as the macromodel design, the schematic design, and/or the extracted design, were selected and whether a Verilog-A file was selected. Based on the identification of the selected design representations and Verilog-A file, the parsing control unit 422 can generate the parsing control signaling 406 for transmission to the analog fault tool.

The analog fault tool can sequentially perform the parsing of the netlists and the macromodel list received from the circuit design tool and perform subsequent cell location organization based on the parsing control signaling 406. For example, when the circuit design tool provides the netlists in an iterative or serial-fashion, the parsing control signaling 406 can prompt the analog fault tool to parse the netlists in an iterative or serial fashion. In other words, the circuit design tool, in response to netlist control signaling 404 from the analog fault simulation control tool, can generate a netlist for one design representation, and forward the netlist to the analog fault tool. The analog fault tool, in response to parsing control signaling 406 from the analog fault simulation control tool, can parse and organize the netlist for subsequent utilization in analog fault simulation. After the netlist has been parsed and organized by the analog fault tool, the analog fault simulation control tool can send additional netlist control signaling 404 to the circuit design tool to generate a netlist for a different design representation.

Figure 6:
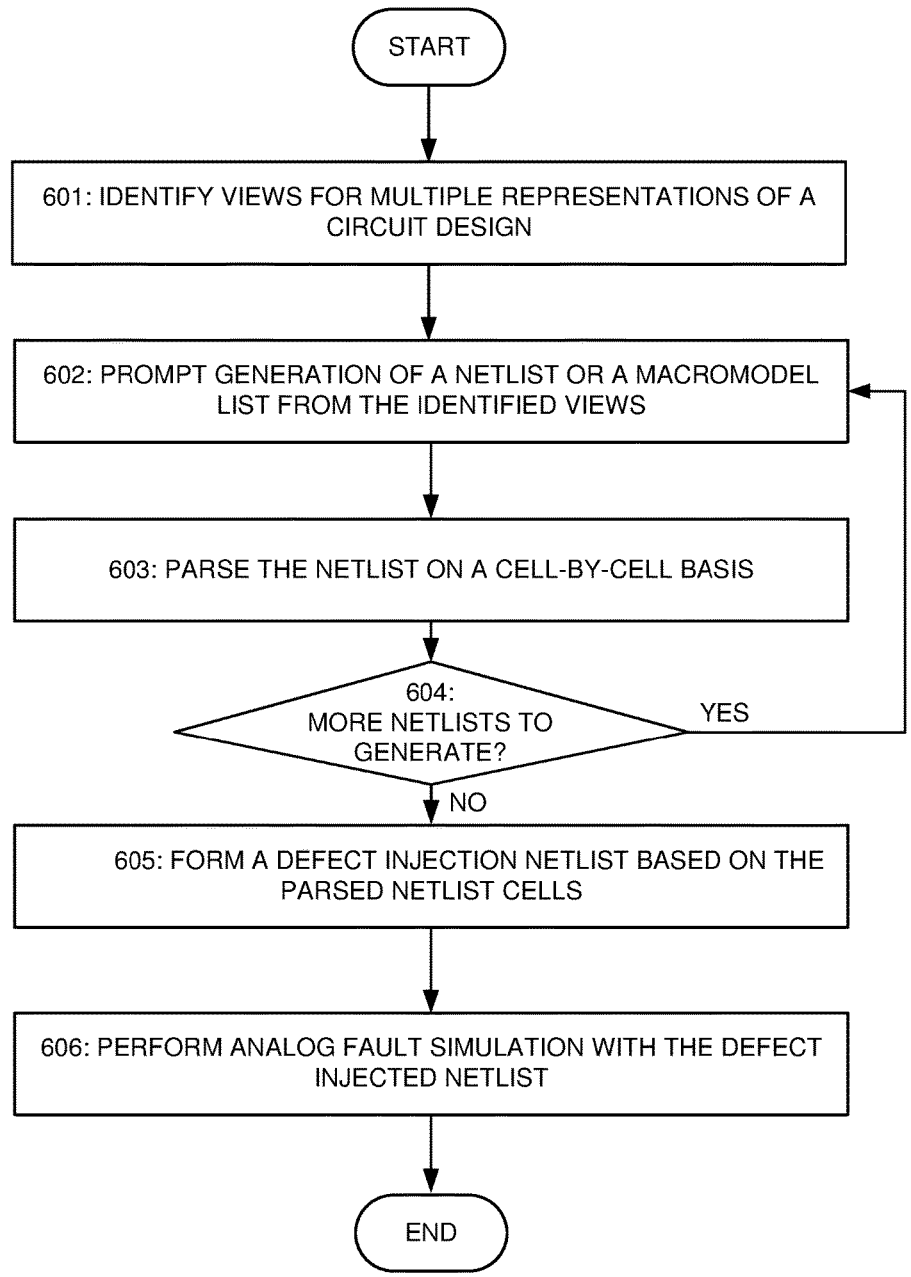
FIG. 6 illustrates a flowchart showing example control of analog fault simulation according to various examples.

FIG. 6 illustrates a flowchart showing example control of analog fault simulation according to various examples. Referring to FIG. 6, in a block 601, a computing system implementing analog fault simulation control can identify views for multiple representations of a circuit design. The computing system implementing analog fault simulation control can receive selections of the circuit design representations, such as macromodel views, schematic views, and/or extracted views, as well as the file names corresponding to the selected circuit design representations via input from a graphical user interface.

In a block 602, the computing system implementing analog fault simulation control can prompt generation of a netlist or a macromodel list from the identified views for the representations of the circuit design. In some embodiments, the computing system implementing analog fault simulation control can generate netlist control signals that, when provided to a circuit design tool, can prompt the circuit design tool to generate a netlist from the identified views for representations of the circuit design. The computing system implementing analog fault simulation control also can generate macromodel control signals that, when provided to the circuit design tool, can prompt the circuit design tool to generate the macromodel list with a pin-accurate subcircuit wrapper for each macromodel from the macromodel views of the circuit design. The computing system implementing analog fault simulation control also can prompt the circuit design tool to output the generated netlist or the generated macromodel list for analog fault simulation. The computing system implementing analog fault simulation control can generate macromodel list control signals that, when provided to the circuit design tool, can prompt the circuit design tool to generate the macromodel list, such as the Verilog-A list described above.

In a block 603, the computing system implementing analog fault simulation control can parse the netlist on a subcircuit-by-subcircuit basis or cell-by-cell basis. The computing system implementing analog fault simulation control can organize the parsed cells or subcircuits from the netlists 308 based on a type of view associated with each of the parsed cells or subcircuits. For example, the macromodel views of parsed cells can be grouped together, the schematic views of the parsed cells can be grouped together, and the extracted views of the parsed cells can be grouped together.

In a block 604, the computing system implementing analog fault simulation control can determine whether to generate more netlists or a macromodel list. When there is at least one more netlist or macromodel list to generate, execution can return to the block 602, where the computing system implementing analog fault simulation control can prompt generation of the netlist or macromodel list. Otherwise, execution can proceed to a block 605, where the computing system implementing analog fault simulation control can form a defect injection netlist based on the parsed netlist cells. In some embodiments, the defect injection netlist can include an aggregate netlist having parsed netlist cells from the multiple views of the circuit design. For example, the aggregate netlist may include cells with different representations used in the circuit design.

In a block 606, the computing system implementing analog fault simulation control can perform analog fault simulation with the aggregate netlist. In some embodiments, the computing system implementing analog fault simulation control can analyze the different representations that have been parsed and organized to determine defects or faults to inject and locations in the cell to inject them. During the analog fault simulation control, the computing system can select from the different representations to trade-off the ability to inject defects or faults, and simulation duration. For example, the computing system can selectively utilize a lower-level representation of a cell, such as from a schematic or extracted representation, to inject a fault or a defect, while selectively utilizing high-level representations of other cells, such as a macromodel representation, for one or more of the other cells. In some implementations, this selective utilization of the different representations of the circuit design during analog fault simulation can allow the computing system implementing analog fault simulation control to reduce duration of the fault simulation without reducing the ability to inject defects.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments, those skilled in the art will appreciate that there are numerous variations and permutations of the above described systems and techniques that fall within the spirit and scope of the invention as set forth in the appended claims. For example, while some of the specific terminology has been employed above to refer to electronic design automation processes, it should be appreciated that various examples of the invention may be implemented using any electronic system.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   identifying, by a computing system, multiple views of cells in a circuit design;
   prompting, by the computing system, generation of multiple netlists, each netlist being generated based on a different combination of the identified views of the cells in the circuit design;
   parsing, by the computing system, each netlist into an organized group of separate cells;
   identifying, by the computing system, one of the cells to inject with a defect; and
   selectively simulating, by the computing system, portions from a plurality of the netlists based, at least in part, on the identified one of the cells to inject with the defect and the organized group of separate cells.

2. The method of claim 1, wherein prompting generation of the netlist further comprises iteratively transmitting netlist control signals to a circuit design tool, wherein each of the netlist control signals is configured to direct the circuit design tool to generate one of the netlists.

3. The method of claim 1, further comprising:
   directing, by the computing system, generation of a list of macromodel views in the circuit design based, at least in part, on text view types and generation of a subcircuit declaration wrapper including correct behavioral bus or bit pin list;
   parsing, by the computing system, the list of macromodel views into the organized group of separate cells; and
   selectively simulating, by the computing system, portions from the plurality of the netlists and a portion of the macromodel views from the list of macromodel views based, at least in part, on the organized group of separate cells.

4. The method of claim 1, wherein the views of the cells in the circuit design include two or more of macromodel design views, schematic design views, or extracted design views.

5. The method of claim 4, wherein the extracted design views corresponds to parasitic elements extracted from a physical layout of the circuit design.

6. The method of claim 1, wherein selectively simulating the portions from the plurality of the netlists further comprises injecting the defect into a portion of the netlist corresponding to the identified one of the cells to inject with the defect, and analyzing results of the simulation to determine whether the defect was detected during the analog fault simulation.

7. The method of claim 1, wherein each view of the circuit design has a different level of design detail and a corresponding simulation throughput.

8. An apparatus comprising at least one computer-readable memory device storing instructions configured to cause one or more processing devices to perform operations comprising:
   identifying multiple views of cells in a circuit design for selective utilization during analog fault simulation of the circuit design;
   prompting generation of multiple netlists, each netlist being generated based on a different combination of the identified views of the cells in the circuit design;
   parsing each netlist into an organized group of separate cells;
   identifying one of the cells to inject with a defect; and
   selectively simulating portions from a plurality of the netlists based, at least in part, on the identified one of the cells to inject with the defect and the organized group of separate cells.

9. The apparatus of claim 8, wherein prompting generation of the netlist further comprises iteratively transmitting netlist control signals to a circuit design tool, wherein each of the netlist control signals is configured to direct the circuit design tool to generate one of the netlists.

10. The apparatus of claim 8, wherein the instructions are configured to cause one or more processing devices to perform operations further comprising:
    directing generation of a list of macromodel views in the circuit design based, at least in part, on text view types and generation of a subcircuit declaration wrapper including correct behavioral bus or bit pin list;
    parsing the list as it is generated into an organized group of separate cells; and
    selectively simulating portions from at least one of the netlists and a portion of the macromodel views from the list of macromodel views based, at least in part, on the organized group of separate cells.

11. The apparatus of claim 8, wherein the views of the cells in the circuit design include two or more of macromodel design views, schematic design views, or extracted design views.

12. The apparatus of claim 11, wherein the extracted design views corresponds to parasitic elements extracted from a physical layout of the circuit design.

13. The apparatus of claim 8, wherein selectively simulating the portions from the plurality of the netlists further comprises injecting the defect into a portion of the netlist corresponding to the identified one of the cells to inject with the defect, and analyzing results of the simulation to determine whether the defect was detected during the simulation.

14. The apparatus of claim 8, wherein each view of the circuit design has a different level of design detail and a corresponding simulation throughput.

15. A system comprising:
    a memory system configured to store computer-executable instructions; and
    a computing system, in response to execution of the computer-executable instructions, is configured to:

identify multiple views of cells in a circuit design for selective utilization during analog fault simulation of the circuit design;

prompt generation of multiple netlists, each netlist being generated based on a different combination of the identified views of the cells in the circuit design;

parsing each netlist into an organized group of separate cells;

identify one of the cells to inject with a defect; and selectively simulate portions from a plurality of the netlists based, at least in part, on the identified one of the cells to inject with the defect and the organized group of separate cells.

16. The system of claim 15, wherein the computing system, in response to execution of the computer-executable instructions, is further configured to iteratively transmit netlist control signals to a circuit design tool, wherein each of the netlist control signals is configured to direct the circuit design tool to generate one of the netlists.

17. The system of claim 15, wherein the computing system, in response to execution of the computer-executable instructions, is further configured to:

direct generation of a list of macromodel views in the circuit design based, at least in part, on text view types and generation of a subcircuit declaration wrapper including correct behavioral bus or bit pin list;

parsing each netlist into an organized group of separate cells; and selectively simulate portions from the plurality of the netlists and a portion of the macromodel views from the list of macromodel views based, at least in part, on the organized group of separate cells.

18. The system of claim 15, wherein the views of the cells in the circuit design include two or more of macromodel design views, schematic design views, or extracted design views.

19. The system of claim 18, wherein the extracted design views corresponds to parasitic elements extracted from a physical layout of the circuit design.

20. The system of claim 15, wherein the computing system, in response to execution of the computer-executable instructions, is further configured to inject the defect into a portion of the netlist corresponding to the identified one of the cells to inject with the defect, and analyze results of the simulation to determine whether the defect was detected during the simulation.

* * * * *